United States Patent [19]
Fujimoto et al.

[11] Patent Number: 5,430,391
[45] Date of Patent: Jul. 4, 1995

[54] DATA INPUT/OUTPUT CONTROL CIRCUIT

[75] Inventors: Yukihiro Fujimoto, Yokohama, Japan; Tsuguo Kobayashi, Sunnyvale; Kazutaka Nogami, Palo Alto, both of Calif.

[73] Assignee: Kabushiki Kaisha Toshiba, Kawasaki, Japan

[21] Appl. No.: 198,066

[22] Filed: Feb. 18, 1994

[30] Foreign Application Priority Data

Feb. 19, 1993 [JP] Japan .................. 5-030760

[51] Int. Cl.⁶ ............................. H03K 19/02
[52] U.S. Cl. .................... 326/57; 326/119; 326/58
[58] Field of Search ............... 307/450–451, 307/473, 443; 326/119, 121, 57–58, 27

[56] References Cited

U.S. PATENT DOCUMENTS

| | | | |
|---|---|---|---|
| 4,855,623 | 8/1989 | Flaherty | 307/451 |
| 4,963,766 | 10/1991 | Lundberg | 307/451 |
| 5,109,166 | 4/1992 | Coburn | 307/451 |
| 5,132,568 | 7/1992 | Kim | 307/451 |
| 5,179,300 | 1/1993 | Rolandi | 307/451 |

Primary Examiner—Edward P. Westin
Assistant Examiner—Andrew Sanders
Attorney, Agent, or Firm—Foley & Lardner

[57] ABSTRACT

There is disclosed a data input/output control circuit comprising: an input/output circuit for carrying out input of data from the exterior or output of data thereto; and an output circuit such that when the input/output circuit carries out output of data, it delivers, to the input/output circuit, data generated in the exterior and transferred by way of a signal line, while when the input/output circuit carries out input of data, it allows the node between the input/output circuit and the signal line to be placed in high impedance state. In this control circuit, the output circuit includes a switching element and a discharge element connected in series between the signal line and the input/output circuit. The switching element is operative in such a manner that when the input/output circuit carries out output of data, it is closed, while when the input/output circuit carries out input of data, it is opened. In addition, the discharge element is operative in such a manner that when the input/output circuit carries out output of data, it is inoperative, while when the input/output circuit carries out input of data, it discharges the node the switching element and the input/output circuit, thus placing the node between the input/output circuit and signal line in high impedance state.

4 Claims, 4 Drawing Sheets

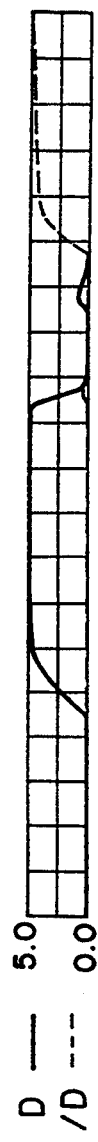
FIG. 5(a)  D ——   /D ---
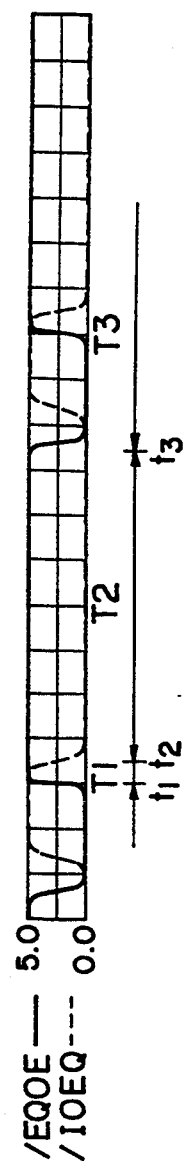
FIG. 5(b)  /EQOE ——   /IOEQ ---
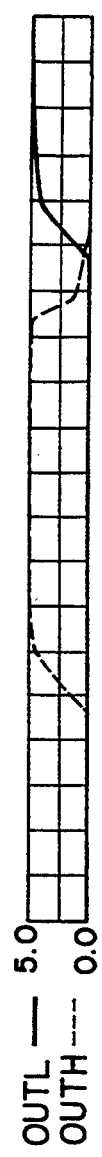
FIG. 5(c)  OUTL ——   OUTH ---
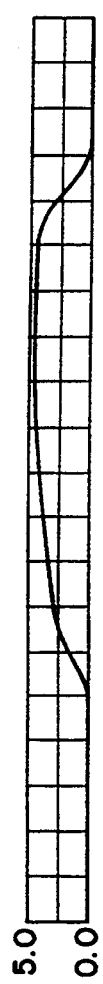
FIG. 5(d)  OUTPUT ——

DATA INPUT/OUTPUT CONTROL CIRCUIT

BACKGROUND OF THE INVENTION

This invention relates to a circuit for controlling input/output of data in a semiconductor device.

The configuration of a data input/output control circuit in a semiconductor device related to this invention is shown in FIG. 6. At an input/output terminal 15 to which data is inputted and from which data is outputted, an input/output circuit 14 is provided. This input/output circuit 14 includes N-channel transistors 16 and 17. Source of the N-channel transistor 16 is connected to power supply voltage VDD terminal, and drain of the N-channel transistor 16 is connected to the input/output terminal 15 together with drain of the N-channel transistor 17. Source of the N-channel transistor 17 is connected to ground voltage Vss terminal.

Respective gates of the N-channel transistors 16 and 17 are connected to the output side of an output circuit 13. The output circuit 13 includes two two-input NOR circuits 11 and 12, and their output terminals are respectively connected to the gates of transistors 16 and 17. To two input terminals of the NOR circuit 11, a signal line 102 through which an inverted signal /D obtained by inverting output data generated in an internal circuit (not shown) is transferred and a signal line 103 through which an output enable signal /OE is transferred are respectively connected. On the other hand, to two input terminals of the NOR circuit 12, a signal line 101 through which output data D is transferred and the signal line 103 are respectively connected.

This data input/output control circuit operates as follows. When output enable signal /OE of low level is inputted to the output circuit 13, two NOR circuits 11 and 12 operate as an inverter. When output data D is at low level (inverted signal /D is at high level), only N-channel transistor 17 is turned ON in the input/output circuit 14. As a result, a signal of low level is outputted from the input/output terminal 15. On the other hand, when output data is at high level (inverted signal /D is at low level), only N-channel transistor 16 is turned ON oppositely to the above. As a result, a signal of high level is outputted from the input/output terminal 15.

In the case where output enable signal /OE is at high level, NOR circuits 11 and 12 of the output circuit 13 both provide outputs of low level irrespective of data D (inverted signal /D). Thus, N-channel transistors 16 and 17 both maintain OFF state, placing the input/output terminal 15 in high impedance state. As a result, internal circuit (not shown) connected to the output circuit 13 and the input/output terminal 15 are electrically cut off. For this reason, it is possible to input data from the exterior through input/output terminal 15 to other internal circuits (not shown) connected to the input/output terminal 15.

However, there were the following problems in such data input/output control circuit. Since output control of data is carried out by using output enable signal /OE, at least one stage of gate (NOR circuits 11 and 12 in this example) is required between signal lines 101 and 102 for transferring data D and inverted signal /D and input/output circuit 14. This gate causes propagation delay of signal (data), so speed for outputting data to the exterior was lowered.

The configuration of another data input/output control circuit related to this invention is shown in FIG. 7. To signal lines 101 and 102 for transferring output data D and inverted signal /D, input terminals of clocked inverters 21 and 22 are respectively connected. When output enable signal /OE is at low level, these clocked inverters 21 and 22 operate as an inverter, while when it is at high level, their output sides are brought into high impedance state. Between output terminals of clocked inverters 21 and 22 and ground potential Vss terminal, drains of discharge N-channel transistors 23 and 24 are respectively connected. Respective conduction of these transistors 23 and 24 are controlled by output enable signal /OE. Further, gates of transistors 16 and 17 of the input/output circuit 14 are respectively connected to output terminals of clocked inverters 21 and 22 similarly to the circuit shown in FIG. 6.

In the circuit shown in FIG. 7, when output enable signal /OE is at low level, clocked inverters 21 and 22 operate as an inverter, and discharge transistors 23 and 24 are turned OFF. As a result, signals corresponding to the levels of output data D and inverted signal /D are outputted from the input/output terminal 15 to the exterior.

On the other hand, when the output enable signal /OE is at high level, clocked inverters 21 and 22 become inoperative, and transistors 23 and 24 become conductive. As a result, the output terminals of the clocked inverters 21 and 22 are discharged. As a result, signals of low level are inputted to gates of transistors 16 and 17 of the input/output circuit 14. Thus, these transistors are both turned OFF, so the input/output terminal 15 is placed in high impedance state. Thus, there results the state where input of data from the exterior to the input/output terminal 15 can be carried out.

Also in the data input/output control circuit shown in FIG. 7, at least one stage of gate is required between signal lines 101 and 102 and input/output circuit 14. For this reason, propagation delay of signal might take place similarly to the circuit shown in FIG. 6, resulting in lowered data output speed.

In addition, ON/OFF control of transistors 16 and 17 of the input/output circuit 14 is controlled by outputs from NOR circuits 11 and 12, or clocked inverters 21 and 22. At this time, noise may be produced by charge/discharge on the output terminals of NOR circuits 11 and 12, or clocked inverters 21 and 22. For this reason, there was the possibility that any erroneous operation might take place in the transistors 16 and 17.

SUMMARY OF THE INVENTION

Accordingly, an object of this invention is to provide a data input/output control circuit permitting high speed data output, and capable of preventing occurrence of an erroneous operation.

In accordance with this invention, there is provided a data input/output control circuit, comprising: an input/output circuit for carrying out input or output of data from or to the exterior; and an output circuit such that when the input/output circuit carries out output of data, it delivers, to the input/output circuit, data produced in the exterior and transferred by way of a signal line, while when the input/output circuit carries out input of data, it allows the node between the input/output circuit and the signal line to be placed in high impedance state, the output circuit including switching means and discharge means connected in series between the signal line and the input/output circuit, the switching means being operative in such a manner that when the input/output circuit carries out output of data, it is closed, while when the input/output circuit carries out input of data, it is opened; the discharge means being such that when the input/output circuit carries out output of data, it is inoperative, while when the input-/output circuit carries out input of data, it discharges the node between the switching means and the input-/output circuit to allow the node the node between the input/output circuit and the signal line to be placed in high impedance state.

The output circuit includes switching means and discharge means between the signal line and the input-/output circuit, and the switching means operates so that it is closed at the time of output of data and is opened at the time of input of data to thereby control input/output of data. Accordingly, no gate which may cause delay is provided between the signal line and the input/output circuit, thus permitting the output speed to be higher. In addition, there is no necessity of providing an element to carry out charge/discharge such as a gate on the input terminal of the input/output circuit, thus making it possible to prevent an erroneous operation.

In the preferred embodiment, a MOS type transistor or CMOS type transmission gate may be used as the switching means. In the case where CMOS type transmission gate is used, on-resistance can be reduced, thus permitting data output speed to be higher.

Further, a latch circuit for holding data outputted from the switching means may be further provided between the switching means and the input/output circuit. In this case, even if there is employed an approach to once open switching means at the time of outputting data to allow the latch circuit to hold data thereafter to close the switching means, there is no obstruction to application of data to the input/output circuit. Accordingly, the degree of freedom of timing for controlling ON/OFF of the switching means is caused to be higher.

In addition, means for holding a potential on the signal line before the input/output circuit outputs data so that it becomes equal to a predetermined potential may be provided between the signal line and the switching means. In this case, any erroneous operation by the influence of data which has been outputted earlier is prevented from occurring.

BRIEF DESCRIPTION OF THE DRAWINGS

In the accompanying drawings:

FIGS. 5(a), (b), (c) and (d) are timing charts showing waveforms of respective signals in the data input/output control circuit according to the fourth embodiment, respectively;

DESCRIPTION OF THE PREFERRED EMBODIMENTS

Preferred embodiments of this invention will now be described with reference to the attached drawings. Respective embodiments are characterized in that signal lines for respectively transferring data D and /D and input/output circuit are connected by switching means to control ON/OFF of the switching means by an output enable signal.

Figure 1:
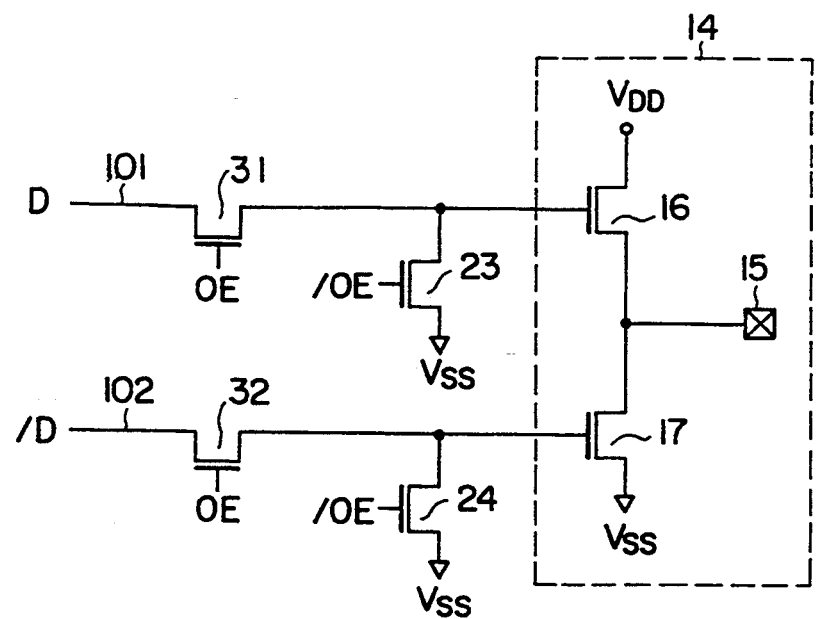
FIG. 1 is a circuit diagram showing the configuration of a data input/output control circuit according to a first embodiment of this invention.
Figure 6:
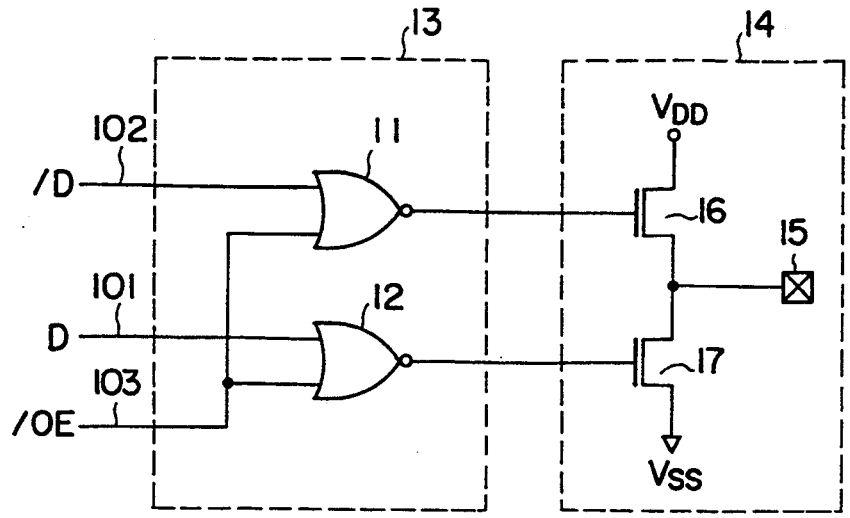
FIG. 6 is a circuit diagram showing the configuration of a data input/output control circuit related to this invention.
Figure 7:
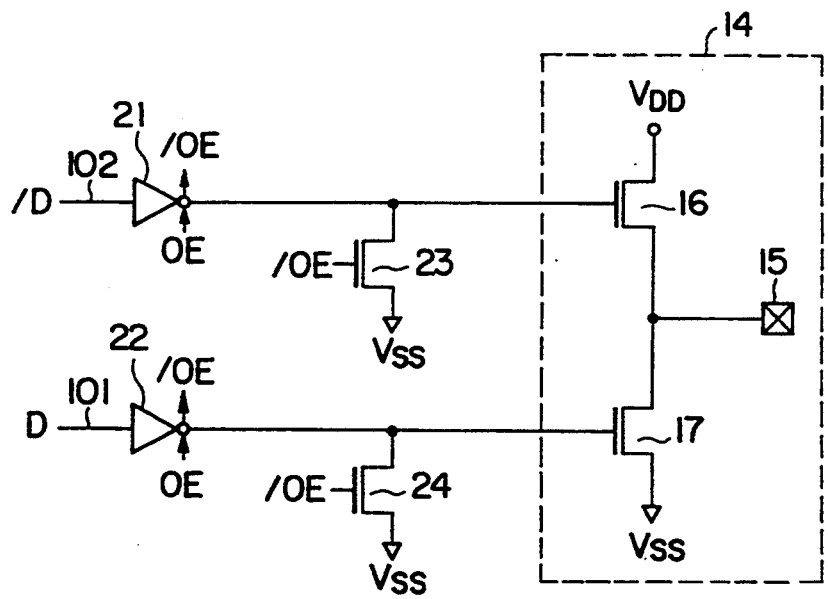
FIG. 7 is a circuit diagram showing the configuration of another data input/output control circuit related to this invention.

Initially, the configuration of a data input/output control circuit according to a first embodiment is shown in FIG. 1. In this embodiment, input/output circuit 14 identical to that shown in FIG. 6 or 7 is provided. Between gates of transistors 16 and 17 of the input/output circuit 14 and signal lines 101 and 102, drains/sources of N-channel transistors 31 and 32 functioning as switching means are respectively connected. Gates of transistors 31 and 32 are supplied with an output enable signal OE. Further, between respective sources of transistors 31 and 32 and ground voltage Vss terminal, drains/sources of discharge N-channel transistors 23 and 24 are connected. Respective gates of these transistors 23 and 24 are supplied with an output enable signal /OE. The same reference numerals are attached to the same components as those shown in FIGS. 6 and 7, and their explanation will be omitted.

The input/output control circuit thus constructed according to this embodiment operates as follows.

When output of data is carried out, output enable signal /OE is caused to be at low level (signal OE is caused to be high level). As a result, transistors 31 and 32 are both turned ON, and discharge transistors 23 and 24 are both turned OFF. Output data D, /D which have been respectively transferred through signal lines 101 and 102 are delivered to input/output circuit 14 via transistors 23 and 24. In dependency upon the levels of data D, /D, ON/OFF states of transistors 16 and 17 are switched. As a result, the value of output data D is outputted from input/output terminal 15 to the exterior. For example, when output data D is at low level (inverted signal /D is at high level), only N-channel transistor 17 is turned ON in the input/output circuit 14. As a result, a signal of low level is outputted from the input/output terminal 15. In contrast, when output data D is at high level (inverted signal /D is at low level), only N-channel transistor 16 is turned ON in the input-/output circuit 14. As a result, a signal of high level is outputted from input/output terminal 15.

On the other hand, when input of data is carried out, output enable signal /OE is caused to be at high level (signal OE is caused to be at low level). Thus, switching transistors 31 and 32 are both turned OFF, and discharge transistors 23 and 24 are turned ON. Since a signal of low level is inputted to respective gates of transistors 16 and 17 of input/output circuit 14, they are turned OFF, placing output terminal 15 in high impedance state. Thus, the nodes between input/output terminal 15 and signal lines 101 and 102 are placed in high impedance state. As a result, the level of input/output terminal 15 has no influence on signal lines 101 and 102. Accordingly, even if a signal is inputted from the exterior to input/output terminal 15, it is possible to transfer this signal to other internal circuits (not shown) without having any influence on signal lines 101 and 102.

In the circuit shown in FIG. 6 or 7, as described above, gates for controlling output of data are required between signal lines and input/output circuit, leading to delay of signal. On the contrary, in accordance with this embodiment, such a gate is unnecessary, and delay of signal produced at the portion from signal lines 101 and 102 to input/output circuit 14 is a delay resulting from each on resistance of transistors 31 and 32. Accordingly, output of data is permitted to be carried out at a higher speed.

Further, in the circuit shown in FIG. 6 or 7, transistors 16 and 17 of input/output circuit 14 were not driven by directly using output data D and /D, but were driven by using signals generated from OR circuits 11 and 12, or clocked inverters 21 and 22. For this reason, charge/discharge was carried out in dependency upon a change of signal on the output terminal of gate such as OR circuit or clocked inverter, so any noise took place. On the contrary, in this embodiment, conductions of transistors 16 and 17 are controlled by directly using output data D and /D. Thus, no noise is produced, thus making it possible to prevent occurrence of erroneous operation.

Figure 2:
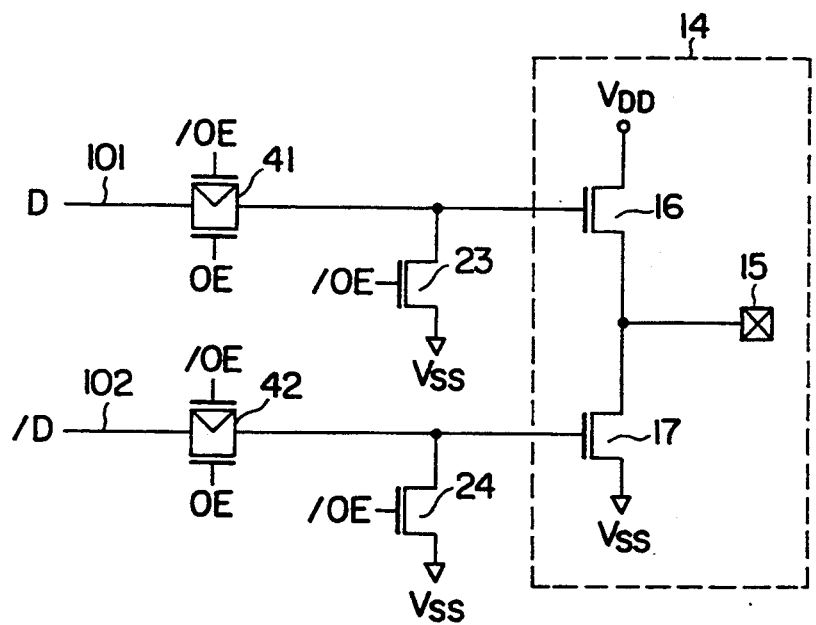
FIG. 2 is a circuit diagram showing the configuration of a data input/output control circuit according to a second embodiment of this invention.

The configuration of a second embodiment according to this invention is shown in FIG. 2. In the first embodiment, N-channel transistors 31 and 32 were used as switching means for connecting signal lines 101 and 102 and input/output circuit 14. On the contrary, the second embodiment differs from the first embodiment in that CMOS type transmission gates 41 and 42 each comprised of a P-channel transistor and an N-channel transistor are used as switching means. Output enable signal /OE is inputted to the gate of the P-channel transistor of CMOS type transmission gates 41 and 42, and output enable signal OE is inputted to the gate of the N-channel transistor. Other components are the same as those of the first embodiment, and their explanation is omitted here.

Also in the second embodiment, similarly to the first embodiment, when output of data is carried out, output enable signal /OE is caused to be at low level and signal OE is caused to be at high level. As a result, CMOS type transmission gates 41 and 42 are turned ON and discharge transistors 23 and 24 are turned OFF. On the other hand, at the time of input of data, output enable signal /OE is caused to be at high level and the signal OE is caused to be at low level in a manner opposite to the above. As a result, CMOS type transmission gates 41 and 42 are turned OFF and transistors 23 and 24 are turned ON. Thus, input/output terminal 15 is placed in high impedance state.

Also in accordance with the second embodiment, advantages similar to those of the first embodiment can be provided. Namely, delay of signal produced at the portion from signal lines 101 and 102 to input/output circuit 14 is a delay resulting from on resistance of each of CMOS type transmission gates 41 and 42. Accordingly, output of data is permitted to be carried out at a higher speed.

In the first embodiment, only N-channel transistors 31 and 32 were used as switching means. For this reason, when they are turned ON, voltage drops by a value corresponding to each threshold value of transistors 31 and 32. On the contrary, in the second embodiment, CMOS type transmission gates 41 and 42 are used. Accordingly, such a voltage drop can be reduced, thus making it possible to improve the characteristic.

In addition, also in the second embodiment, output data D and /D are directly used to control conductions of transistors 16 and 17. Accordingly, no noise is produced, thus making it possible to prevent an erroneous operation.

Figure 3:
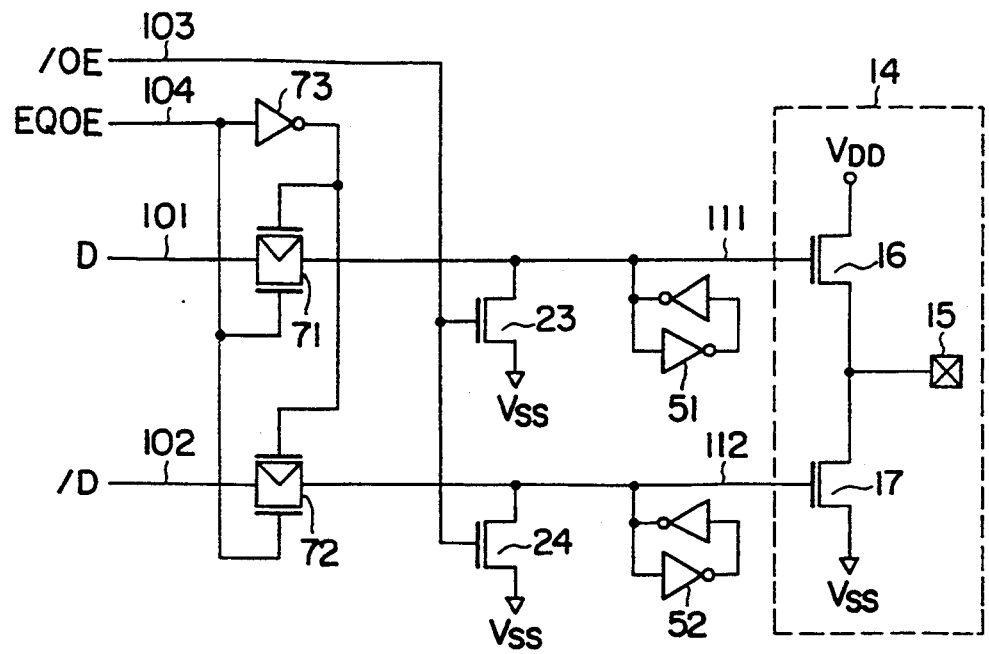
FIG. 3 is a circuit diagram showing the configuration of a data input/output control circuit according to a third embodiment of this invention.

The configuration of a third embodiment according to this invention is shown in FIG. 3. In this embodiment, CMOS transmission gates 71 and 72 are used as switching means for connecting signal lines 101 and 102 and input/output circuit 14. Switching (ON/OFF) operations of CMOS transmission gates 71 and 72 are controlled by an equalize signal EQOE except for output enable signal. Equalize signal EQOE is inputted to the gate of N-channel transistor of transistors constituting CMOS type transmission gate, and a signal/EQOE inverted at an inverter 73 is inputted to the gate of P-channel transistor thereof.

Further, potentials on the output terminal of the CMOS type transmission gates 71 and 72 are held by latch circuits 51 and 52 each comprised of two inverters.

At the time of output of data, output enable signal /OE is caused to be at low level. N-channel transistors 23 and 24 are turned OFF. Further, equalize signal EQOE is caused to be at high level, so CMOS type transmission gates 71 and 72 are turned ON. Output data D, /D which have been transferred through signal lines 101 and 102 are inputted to input/output circuit 14 through CMOS type transmission gates 71 and 72. In dependency upon the levels of data D, /D, ON/OFF states of transistors 16 and 17 are switched. Thus, the value of output data D is outputted from the input/output terminal 15 to the exterior.

On the other hand, at the time of input of data, output enable signal /OE is caused to be at high level. As a result, transistors 23 and 24 are turned ON. Further, equalize signals EQOE is caused to be at low level, so CMOS type transmission gates 71 and 72 are turned OFF. Signal lines 101 and 102 are caused to be at low level, and transistors 16 and 17 are turned OFF. Input/output terminal 15 is placed in high impedance state.

In the third embodiment, output enable signal /OE for controlling discharge transistors 23 and 24 and equalize signal EQOE for controlling CMOS type transmission gates 71 and 72 are independent. Accordingly, for example, at the time of output of data, an approach may be employed to allow output enable signal /OE to be at low level to place transistors 23 and 24 in OFF state to shift the level of equalize signal EQOE from high level to low level while keeping that state, thus permitting CMOS transmission gates 71 and 72 to shift from ON state to OFF state.

As stated above, even if CMOS type transmission gates 71 and 72 are closed in the course of output of data, prior potentials on signal lines 101 and 102 are held by latch circuits 51 and 52. For this reason, there is no obstruction to output of data.

In accordance with the third embodiment, not only advantages similar to those of the first and second embodiments can be obtained, but also higher degree of freedom in relation to the data input/output control can be obtained without providing obstruction to output of data from input/output terminal 15.

Figure 4:
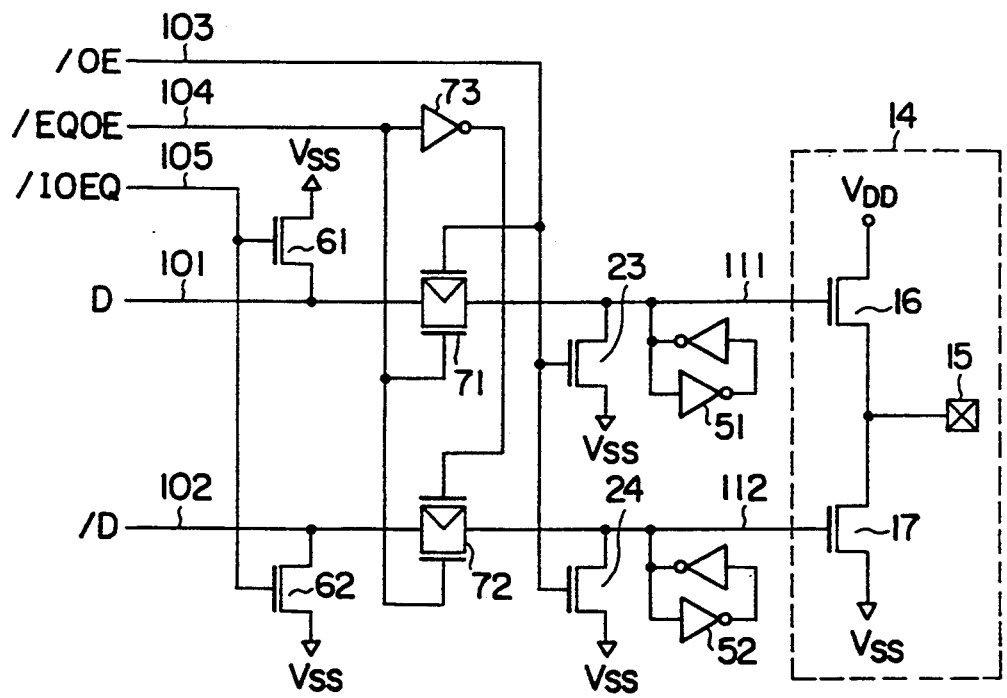
FIG. 4 is a circuit diagram showing the configuration of a data input/output control circuit according to a fourth embodiment of this invention.

The configuration of a data input/output control circuit according to a fourth embodiment of this invention is shown in FIG. 4. This embodiment differs from the third embodiment in that discharge N-channel transistors 61, 62 for allowing signal lines 101 and 102 to be at low level are further provided. Gates of these transistors 61 and 62 are supplied with an output equalize signal /IOEQ. Further, in this embodiment, in CMOS type transmission gates 71 and 72, equalize signal /EQOE is inputted to the gate of the N-channel transistor, and equalize signal EQOE inverted at inverter 73 is inputted to the gate of the P-channel transistor.

Output data D and /D, equalize signal /EQOE, output equalize signal /IOEQ, potentials OUTL and OUTH on signal lines 111 and 112 held by latch circuit 51, and output potential outputted from input/output terminal 15 are respectively shown in FIGS. 5(*a*) to (*d*).

At the time of outputting data, equalize signal /EQOE is caused to be first at low level (signal EQOE is caused to be at high level), thus placing CMOS type transmission gates 71 and 72 in OFF state. In this state, output equalize signal /IOEQ is caused to be at high level to allow transistors 61 and 62 to be turned ON, thus holding potentials on signal lines 101 and 102 at low level.

Thereafter, from time t1, equalize signal/EQOE is caused to be at high level to allow CMOS type transmission gates 71 and 72 to be turned ON. For a short time period T1 from the time point t1 to time point t2 when output equalize signal /IOEQ falls down to low level to allow discharge transistors 23 and 24 to be turned OFF, CMOS type transmission gates 71 and 72 and transistors 61 and 62 are all in ON state. For this time period T1, charges remaining on the signal lines 101 and 102 are discharged, so these signal lines are caused to be at low level.

From the time point t2, transistors 61 and 62 are turned OFF, resulting in the state where CMOS type transmission gates 71 and 72 are turned ON. For a time period T3 from this time point t2 to time point t3 when the equalize signal /EQOE is switched to low level, data D and /D are respectively outputted to signal lines 111 and 112.

Also at time point t3 when equalize signal /EQOE shifts to low level so that CMOS type transmission gates 71 and 72 are turned OFF and times subsequent thereto, potentials of data D and /D outputted from the signal lines 111 and 112 are held by latch circuits 51 and 52. The potentials latched at this time period T3 are outputted from input/output terminal 15 to the exterior through input/output circuit 14.

As stated above, in accordance with this embodiment, an approach is employed to discharge, in advance, signal lines 101 and 102 by transistors 61 and 62 prior to outputting data D and /D, thereby making it possible to prevent data D and /D which have been outputted earlier from being propagated to signal lines 101 and 102 even if they are held by latch circuits 51 and 52.

At the time of input of data, this circuit operates in a manner similar to the above-described embodiments. Namely, output enable signal /OE shifts to high level. Thus, discharge transistors 23 and 24 are turned ON, so signal lines 111 and 112 are caused to be at low level. When potentials of low level are inputted to the gates of transistors 16 and 17, these transistors are turned OFF. As a result, input/output terminal 15 is placed in high impedance state.

It should be noted that the above-described embodiments are presented only for illustrative purpose, and therefore do not limit this invention in any sense. For example, while N-channel transistor, or CMOS type transmission gate comprising N-channel transistor and P-channel transistor in combination is used in the above-described embodiments as switching control means, any circuit element capable of varying impedance between signal lines and input/output circuit in dependency upon input/output of data may be used.

In the fourth embodiment shown in FIG. 4, signal lines 101 and 102 are discharged by transistors 61 and 62 prior to carrying out output of data, thus holding them at low level. However, before output of data is carried out, it is not necessarily required to place signal lines 101 and 102 at low level. For example, they may be precharged to, e.g., a potential intermediate between high level and low level of data.

What is claimed is:

1. A data input/output control circuit, comprising:
   an input terminal for inputting data;
   an input/output circuit connected to said input terminal via a signal line having an input/output terminal, in which said input/output circuit receives the inputted data through the signal line and outputs the inputted data via the input/output terminal to the exterior in a data output mode, and said input/output circuit not outputting the inputted data via the input/output terminal regardless of a level of said input terminal in a high impedance mode; and
   an output circuit provided at the signal line, in which said output circuit supplies the inputted data to said input/output circuit via the signal line when said input/output circuit is in a data output mode, and places the signal line in a high impedance state when said input/output circuit is in a high impedance mode;
   wherein said output circuit includes:
   switching means with both ends connected between the signal line, said switching means closing when said input/output circuit is in a data output mode and opening when said input/output circuit is in the high impedance mode,
   discharge means with one end connected to the signal line and the other end being grounded, said discharge means being inoperative when said input/output circuit is in the data output mode and discharging the signal line when said input/output circuit is in the high impedance mode, and
   a latch circuit provided at the signal line between said discharge means and said input/output circuit and holding the inputted data outputted from said switching means.

2. A data input/output control circuit as set forth in claim 1,
   wherein a first control signal for controlling the operation of said discharge means and a second control signal for controlling the operation of said switching means are independent of each other, and
   wherein when said input/output circuit is in the data output mode, said discharge means does not carry out discharge operation by said first control signal, and said switching means shifts from an opened state to a closed state by said second control means, whereby data which has been outputted when said switching means is opened is held by said latch circuit after said switching means is closed.

3. A data input/output control circuit as set forth in claim 1, which further comprises, between said signal line and said switching means, equalizing means for holding, before said input/output circuit is in the data output mode, a potential on said signal line so that it becomes equal to a predetermined potential.

4. A data input/output control circuit as set forth in claim 3, wherein a first control signal for controlling the operation of said discharge means, a second control signal for controlling the operation of said switching means, and a third control signal for controlling the operation of said equalizing means are independent of each other, wherein when said input/output circuit is in the data output mode, said discharge means does not carry out discharge operation by said first control signal, said switching means is closed by said second control signal, and said equalizing means becomes operative by said third control signal so that a potential on said signal line is held at a predetermined potential, wherein, at a subsequent time, said switching means is opened by said second control signal, said equalizing means remains in an operative state, and a potential on the node between said switching means and said input/output circuit is held at the predetermined potential on said signal line, and wherein, at a further subsequent time, said equalizing means becomes inoperative by said third control signal such that data which has been transferred from said signal line is delivered to said input/output circuit through said switching means.

* * * * *